United States Patent [19]

Kaneko et al.

[11] Patent Number: 4,736,841

[45] Date of Patent: Apr. 12, 1988

[54] ELECTRONIC COMPONENT SERIES

[75] Inventors: Fumihiko Kaneko; Takashi Kawamura; Kimiharu Anao; Keiichi Shimamaki, all of Nagaokakyo, Japan

[73] Assignee: Murata Manufacturing Co., Ltd., Japan

[21] Appl. No.: 828,021

[22] Filed: Feb. 10, 1986

[30] Foreign Application Priority Data

Feb. 20, 1985 [JP] Japan .................................. 60-32305
Mar. 27, 1985 [JP] Japan .................................. 60-62287

[51] Int. Cl.$^4$ ............................................. B61D 73/02
[52] U.S. Cl. ................................... 206/332; 206/328; 206/334; 220/359; 220/22
[58] Field of Search ....................... 206/328, 334, 484; 220/359, 20, 22; 206/332

[56] References Cited

U.S. PATENT DOCUMENTS 4,450,959  5/1984  Sommer .................................. 206/334
4,605,007  8/1986  Heraly ..................................... 206/328
4,605,142  8/1986  Itoh et al. ............................... 220/359

FOREIGN PATENT DOCUMENTS 2310295  10/1973  Fed. Rep. of Germany ...... 220/359

Primary Examiner—Joseph Man-Fu Moy
Attorney, Agent, or Firm—Ostrolenk, Faber, Gerb & Soffen

[57] ABSTRACT

In an electronic component series of the type wherein a plurality of electronic components are distributed in the longitudinal direction of a tape-like receiving member to be retained by the same, a cover tape is heat-sealed to a receiving tape having receiving concavities for receiving the respective electronic components. Stepped portions or protrusions are forned in the receiving tape to define regions not in contact with the cover tape. This restricts the extent of the sealed regions wherein the cover tape is heat-sealed to the receiving tape, such that the sealed regions are substantially constant in width which results in a substantially constant force being required for removing the cover tape from the receiving tape.

12 Claims, 6 Drawing Sheets

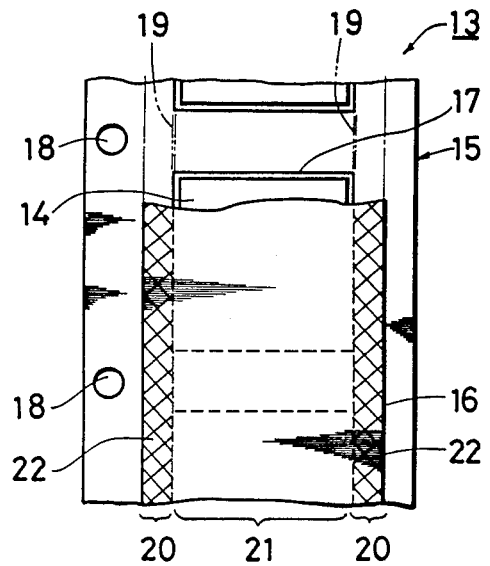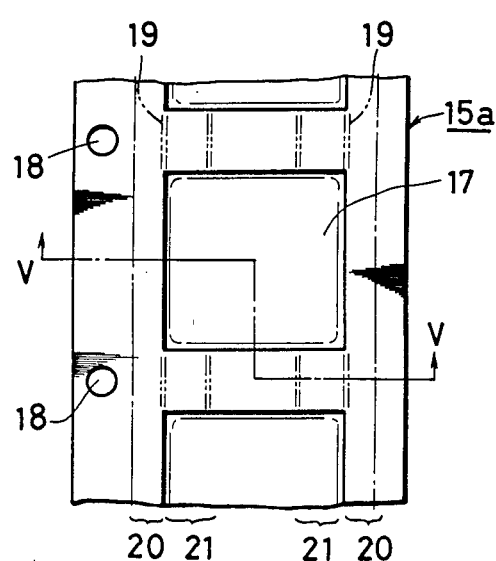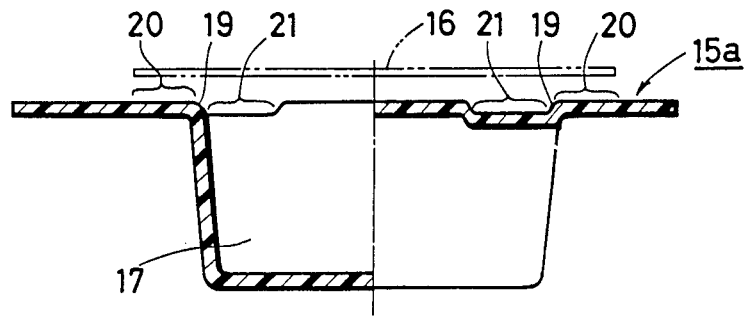

ELECTRONIC COMPONENT SERIES

BACKGROUND OF THE INVENTION

1. Field of the Invention

The present invention relates to an electronic component series which comprises a tape-like receiving member for receiving a plurality of electronic components distributed along the longitudinal direction thereof, and more particularly, it relates to an electronic component series in which a cover tape is heat-sealed to a receiving tape provided with concavities for receiving the respective electronic components.

2. Description of the Prior Art

U.S. Pat. No. 4,298,120 discloses various examples of electronic component series which are of background interest to the present invention.

FIG. 13 is an exploded perspective view partially showing a conventional electronic component series. The electronic component series 1 shown therein comprises a receiving tape 3, in order to receive a plurality of electronic components 2. The receiving tape 3 is formed with a plurality of receiving concavities 4 which are distributed along its longitudinal direction. When the receiving tape 3 is made of, e.g., a sheet of thermoplastic resin, the receiving concavities 4 can be formed by embossing the same. The receiving tape 3 is also formed with a plurality of feeding perforations 5 which are distributed along the longitudinal direction thereof.

In order to retain the electronic components 2 in the receiving concavities 4, a cover tape 6 is arranged along the longitudinal direction of the receiving tape 3, to cover the respective receiving concavities 4. The cover tape 6 is made of thermoplastic resin, and regions 7 close to both side edges thereof, which regions 7 are shown in a cross-hatched manner in FIG. 13, are heated so that the cover tape 6 is heat-sealed to the receiving tape 3.

The aforementioned sealing process is generally performed by utilizing a sealing iron 9 which contains a heater 8, as shown in FIGS. 14 and 15. The sealing iron 9 has a pair of contact surfaces 10 which extend linearly in parallel with each other. The sealing iron 9 brings the contact surfaces 10 in contact with portions of the cover tape 6 close to both side edges thereof from above the electronic component series 1 which is intermittently fed, thereby to seal the regions 7 of the cover tape 6 as shown in FIG. 13 to the receiving tape 3.

FIGS. 16 to 18 are plan views showing three examples of electronic component series which are obtained by sealing cover tapes 6 to receiving tapes 3 by the sealing iron 9 as shown in FIGS. 14 and 15. Referring to FIGS. 16 to 18, cross-hatched parts of respective side edges of the cover tapes 6 show heat-sealed portions 11. Further, regions defined by one-dot chain lines are contact/heated regions 12 to be in contact with the aforementioned contact surfaces 10.

The electronic component series 1a, 1b and 1c as shown in FIGS. 16 to 18 respectively are standardized in size to be commonly processed by a specific automatic apparatus, and regularly set are pitches for arranging receiving concavities 4a, 4b and 4c and feeding perforations 5, respective widths of the receiving and cover tapes 3 and 6. However, the receiving concavities 4a, 4b and 4c are varied in size, in order to receive different-sized electronic components 2a, 2b and 2c.

The electronic component series 1a as shown in FIG. 16 is provided with relatively small receiving concavities 4a. In this case, the heat-sealed portions 11 are formed to be substantially equal in width to the contact/heated regions 12.

The electronic component series 1b as shown in FIG. 17 is provided with relatively large receiving concavities 4b, which are particularly wide in the cross direction. In this case, no heat-sealed portion 11 is formed in portions of the contact/heated regions 12 under which the receiving concavities 4b are located, and the heat-sealed portions 11 are increased and decreased in width at regular intervals.

The electronic component series 1c as shown in FIG. 18 is provided with receiving concavities 4c which are exactly interposed between the two contact/heated regions 12. Therefore, the heat-sealed portions 11 are originally formed in correspondence to the contact/heated regions 12, whereas, undesirably, the same inwardly extend in regions between respective adjacent receiving concavities 4c due to the configuration of the sealing iron 9 as shown in FIGS. 14 and 15. This is because heat radiated from the contact surfaces 10 and their vicinity of sealing iron 9 is transferred to relatively wide regions of the cover tape 6. Thus, heat sealing is inevitably performed in portions other than the contact/heated regions 12 of the cover tape 6, which portions are in contact with the receiving tape 3. Such inward extension of the heat-sealed portions 11 also takes place in the electronic component series 1a and 1b as shown in FIGS. 16 and 17, and hence the heat-sealed portions 11 cannot be maintained constant in width in any of the electronic component series 1a, 1b and 1c, regardless of the sizes of the receiving concavities.

When the heat-sealed portions 11 are varied in width as in the aforementioned examples shown in FIGS. 16 to 18, the following problems are caused in steps of supplying the electronic components 2a, 2b and 2c through such electronic component series 1a, 1b and 1c in practice:

In general, an electronic component series is fed in its longitudinal direction through the feeding perforations while, simultaneously, its cover tape is upwardly moved to be separated from the receiving tape. Thereafter the electronic components retained in the receiving cavities are taken out from the same to be supplied to a prescribed printed circuit board or the like.

In view of the aforementioned step of separating the cover tape from the receiving tape, the force required for such separation is not constant with respect to the longitudinal directions of the cover tapes 6 in the electronic component series 1a to 1c as shown in FIGS. 16 to 18, particularly in 1b and 1c. In other words, a greater force is required to separate the cover tapes 6 from the receiving tapes 3 in regions where the heat-sealed portions 11 are wider, while the cover tapes 6 are separated with smaller force in regions where the portions 11 are narrower. Thus, the forces required for such separation are periodically or non-periodically increased and decreased in all of the electronic component series 1a to 1c. Due to such changes in separation force, the electronic component series 1a, 1b and 1c are undulated in the portions from which the cover tapes 6 are separated, whereby the receiving tapes 3 vibrate in the vertical direction. Such undulations will be intensified as separation speeds are increased.

The undulations as hereinabove described may undesirably bring out the electronic components 2a, 2b and 2c from the receiving concavities 4a, 4b and 4c of the receiving tapes 3 or change the directions thereof after separation of the cover tapes 6, leading to obstructions in the steps of supplying the electronic components 2a, 2b and 2c.

SUMMARY OF THE INVENTION

Accordingly, an object of the present invention is to provide an electronic component series in which heat-sealed portions can be formed with constant width regardless of the sizes of receiving concavities, through heat means such as a sealing iron.

Provided according to the present invention is an electronic component series which comprises a plurality of receiving concavities distributed in the longitudinal direction of a receiving tape for respectively retaining electronic components and a cover tape arranged along the longitudinal direction of the receiving tape for covering the receiving concavities thereby to retain the electronic components in the same. The cover tape is heated in portions close to both side edges thereof so that the cover tape is sealed to the receiving tape by thermoplastic resin provided at least on a surface opposite to the receiving tape. The receiving tape is provided on a surface opposite to the cover tape with regions lower than regions to be welded, which lower regions are bounded by stepped portions linearly extending along the longitudinal direction of the receiving tape to be inside the said regions to be sealed.

According to the present invention, the receiving tape is provided on the surface opposite to the cover tape with regions not in contact with the cover tape, which regions are formed inside the stepped portions. Therefore, the said regions are prevented from heat sealing even if the upper surface of the cover tape is in contact with a heat member such as a sealing iron or subjected to heat from the heat member. Thus, the regions to be heat-sealed will not extend beyond the stepped portions, and the terminating ends of the heat-sealed portions are restricted by the stepped portions. According to the present invention, such stepped portions linearly extend along the longitudinal direction of the receiving tape, whereby the heat-sealed portions of the cover tape can be made substantially constant in width with respect to the longitudinal direction thereof. As the result, the electronic component series, particularly the receiving tape is prevented from undulation in a step of taking out the electronic components with separation of the cover tape, whereby the electronic components are not undesirably brought out from the receiving concavities nor changed in direction.

In a preferred embodiment of the present invention, the receiving tape is provided on the surface opposite to the cover tape with two parallel protrusions linearly extending along the longitudinal direction of the receiving tape on respective sides thereof and having a prescribed width, while the receiving concavities are located between the two protrusions. Therefore, the cover tape is welded in the portions of the two protrusions.

According to the said preferred embodiment, the receiving tape is appropriately spaced from a heat member in portions close to both side edges thereof which are in the exterior of both side edges of the cover tape by the protrusions when the heat member such as a sealing iron is in contact with the upper surface of the cover tape to perform a heat sealing step. Therefore, the receiving tape can be provided substantially with no regard to thermal effects by the heat member, whereby the material therefor can be selected within a wide range.

These and other objects, features, aspects and advantages of the present invention will become more apparent from the following detailed description of embodiments of the present invention when taken in conjunction with the accompanying drawings.

BRIEF DESCRIPTION OF THE DRAWINGS

FIG. 3 is a plan view of the electronic component series 13 as shown in FIG. 1;

FIG. 4 is a plan view showing a receiving tape 15a employed in another embodiment of the present invention;

FIG. 5 is an enlarged sectional view taken along the line V—V in FIG. 4;

DESCRIPTION OF THE PREFERRED EMBODIMENTS

Figure 1:
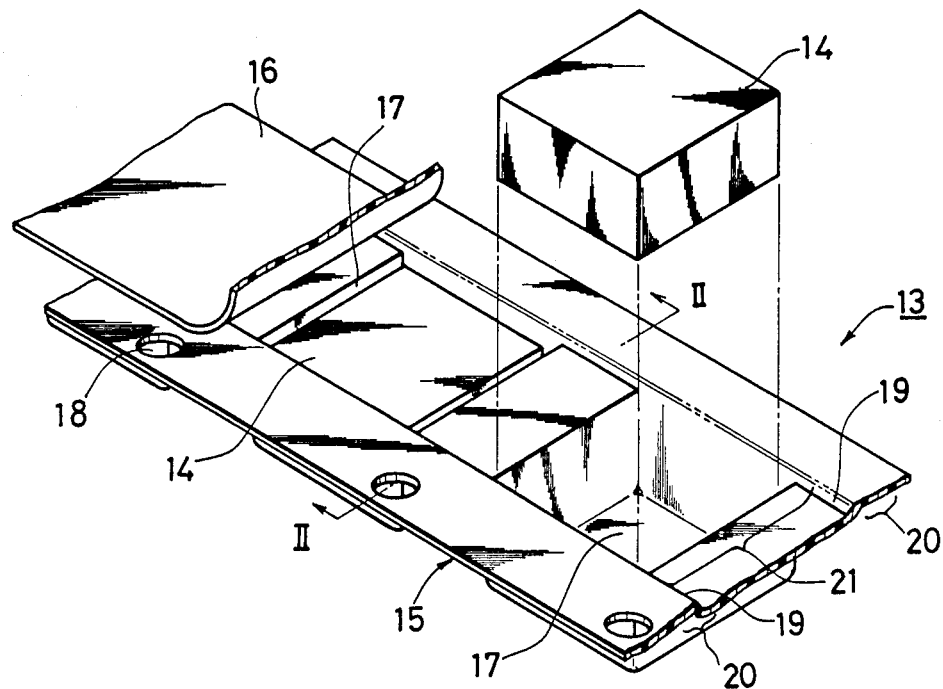
FIG. 1 is an exploded perspective view partially showing an electronic component series 13 according to an embodiment of the present invention.
Figure 2:
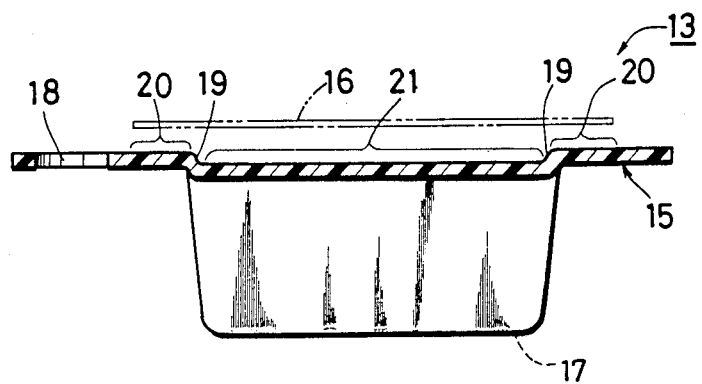
FIG. 2 is an enlarged sectional view taken along the line II—II in FIG. 1.

FIG. 1 is an exploded perspective view partially showing an electronic component series 13 according to an embodiment of the present invention, and FIG. 2 is an enlarged sectional view taken along the line II—II in FIG. 1. FIG. 3 is a plan view of the electronic component series 13.

Figure 13:
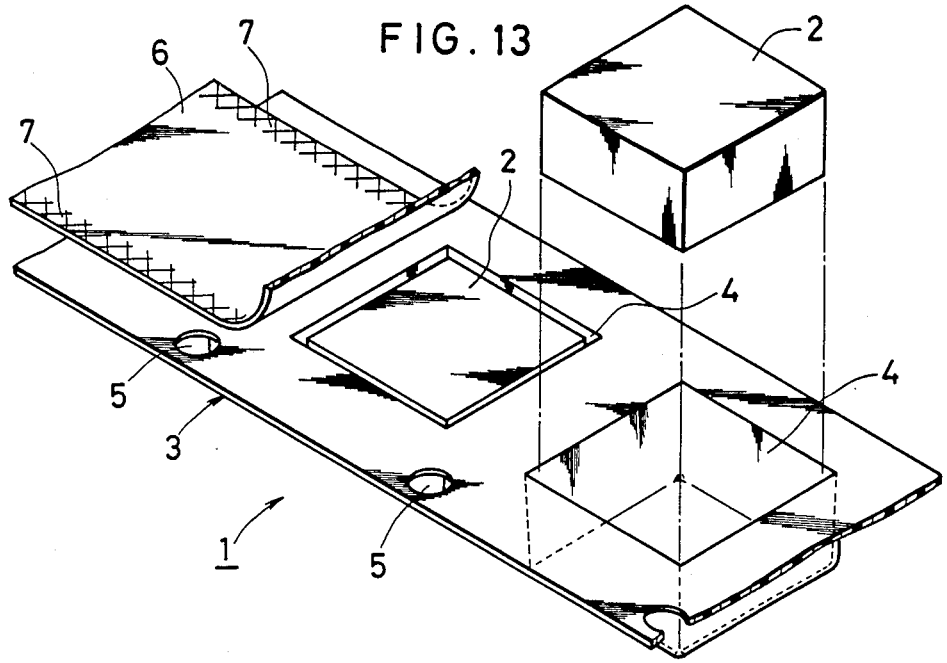
FIG. 13 is an exploded perspective view partially showing a conventional electronic component series 1.

The electronic component series 13 as shown in FIGS. 1 to 3 includes elements substantially similar to those of the electronic component series 1 as shown in FIG. 13. Namely, the electronic component series 13 comprises a plurality of electronic components 14, a receiving tape 15 and a cover tape 16. The receiving tape 15 is formed with a plurality of receiving concavities 17 which are distributed in the longitudinal direction thereof for receiving the electronic components 14 respectively. A plurality of feeding perforations 18 are distributed along the longitudinal direction of the receiving tape 15, along one of the side edges thereof.

The receiving tape 15 is formed on its upper surface with stepped portions 19, which linearly extend along the longitudinal direction of the receiving tape 15. The stepped portions 19 are positioned inside regions to be in contact with the cover tape 16 for sealing, i.e., seal regions 20, and define boundaries between the seal regions 20 and regions lower than the same, i.e., lower regions 21. In this embodiment, the receiving concavities 17 are equalized in width to the lower regions 21.

Figure 14:
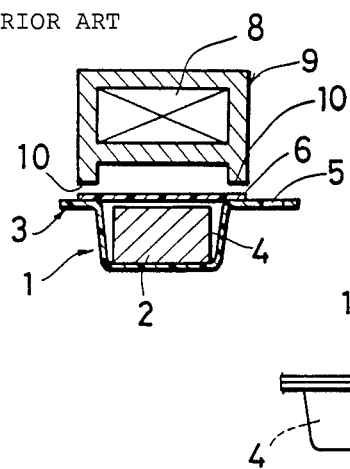
FIG. 14 is a sectional view schematically showing a step of heat sealing a cover tape as shown in FIG. 13 to a receiving tape.
Figure 15:
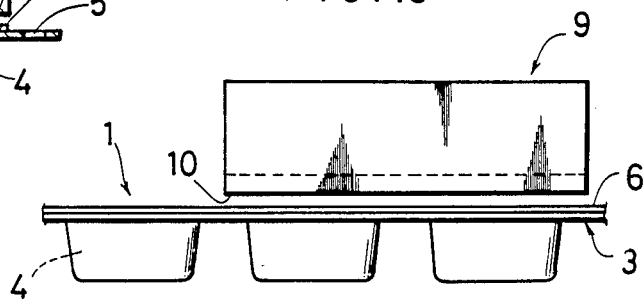
FIG. 15 is a front elevational view of the step as shown in FIG. 14.
Figure 16:
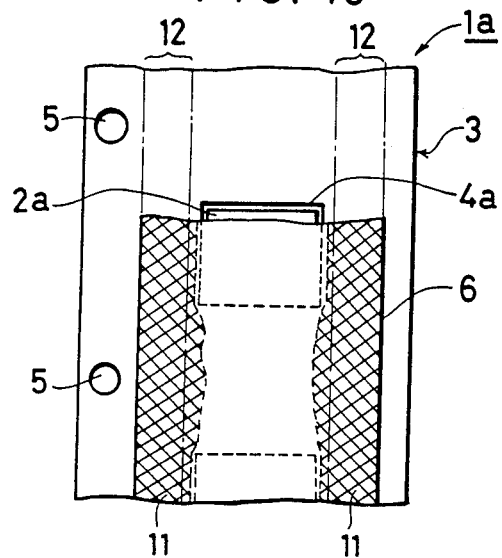
FIGS. 16 to 18 are plan views showing three types of electronic component series 1a, 1b and 1c which are varied with different-sized receiving concavities respectively, for schematically illustrating disadvantages of the conventional electronic component series.
Figure 17:
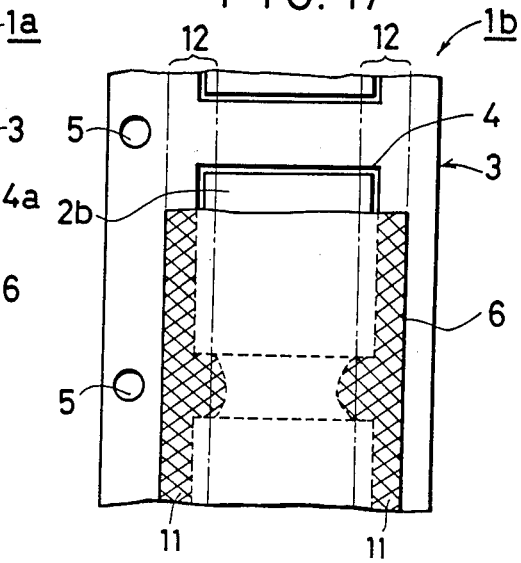
Figure 18:
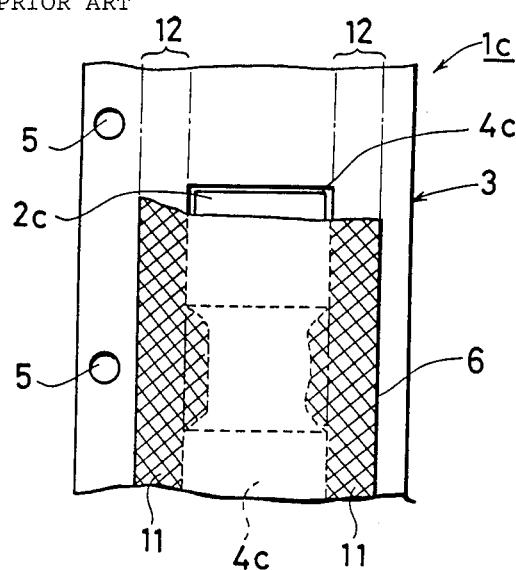

When the cover tape 16 is heat-sealed to the receiving tape 15 through the sealing iron 9 as shown in FIGS. 14 and 15, heat-sealed portions 22 are formed in cross-hatched regions as shown in FIG. 3. As obvious from FIG. 3, the heat-sealed portions 22 correspond to the seal regions 20, and respective inner sides thereof are defined by the stepped portions 19. Thus, the heat-sealed portions 22 are obtained substantially in even width.

FIG. 4 is a plan view showing a receiving tape 15a which is employed in another embodiment of the present invention, and FIG. 5 is an enlarged sectional view taken along the line V—V in FIG. 4. This embodiment is carried out by slightly modifying the embodiment as hereinabove described with reference to FIGS. 1 to 3, and the following description is made only with respect to characteristic portions with similar reference numerals allocated to corresponding parts, for easy understanding of the comparison.

In this embodiment, lower regions 21 are formed only in the vicinity of the stepped portions 19. Therefore, each of the lower regions 21 is separated in two parts, so that a region held between the two parts of the lower region 21 remains at the same level with seal regions 20.

Figure 6:
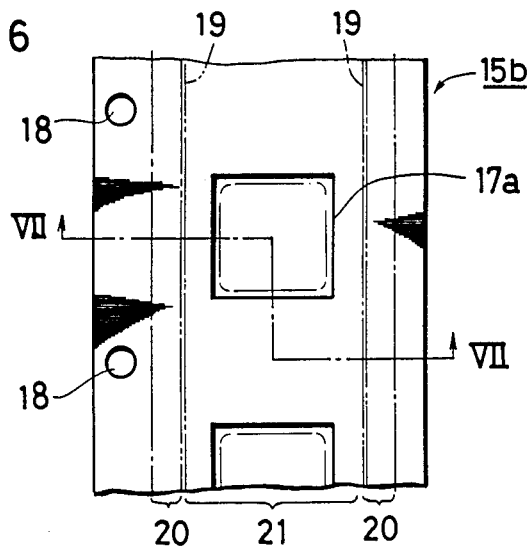
FIG. 6 is a plan view of a receiving tape 15b employed in still another embodiment of the present invention.
Figure 7:
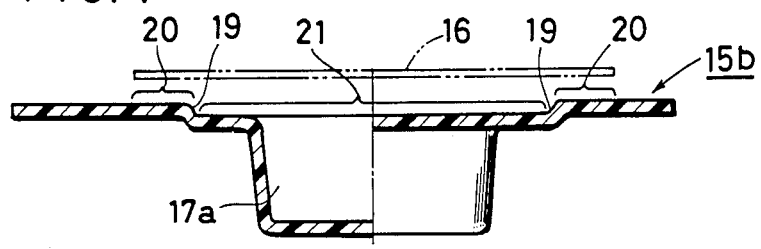
FIG. 7 is an enlarged sectional view taken along the line VII—VII in FIG. 6.

FIG. 6 is a plan view showing a receiving tape 15b which is employed in still another embodiment of the present invention, and FIG. 7 is an enlarged sectional view taken along the line VII—VII in FIG. 6. In this embodiment, the receiving tape 15b is provided with receiving concavities 17a which are relatively small particularly in size in the cross direction. In this case, stepped portions 19 are formed in positions outside the receiving concavities 17a at prescribed intervals. Therefore, the receiving concavities 17a are provided in lower regions 21 which are formed inside the stepped portions 19. Seal regions 20, which are formed in the exterior of the stepped portions 19, are located on the receiving tape 15b and sized substantially identically to the seal regions 20 in the respective embodiments as shown in FIGS. 3 and 4, and hence the same can be sealed by a similar heat sealing means such as the sealing iron 9.

The receiving tapes 15, 15a and 15b employed in the respective embodiments as hereinabove described are made of sheets of thermoplastic resin, which are embossed to form the receiving concavities 17 and 17a, the stepped portions 19 and the like. However, the present invention is also applicable to another type of electronic component series. An example of such an electronic component series is now described with reference to FIG. 8.

Figure 8:
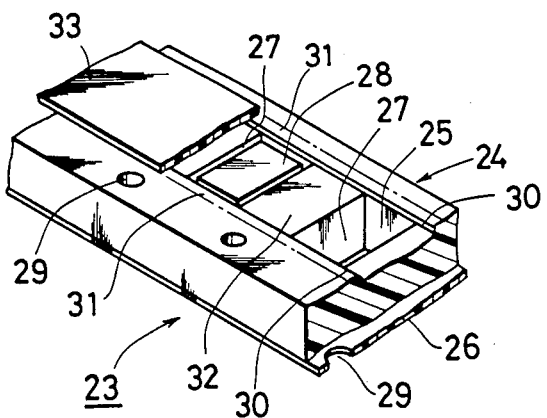
FIG. 8 is a perspective view partially showing an electronic component series 23 according to a further embodiment of the present invention.

FIG. 8 is a perspective view partially showing another type of electronic component series 23. In the electronic component series 23, a receiving tape 24 is formed by a relatively thick material such as cardboard or a strip of synthetic resin. The receiving tape 24 is formed with through-holes 25 which are distributed in its longitudinal direction. A lower tape 26 is adhered to the receiving tape 24 to cover the through-holes 25, thereby to define receiving concavities 27 in the through-holes 25 respectively. The receiving concavities 27 are adapted to receive electronic components 28. The receiving tape 24 is further provided along one of its side edges with a plurality of feeding perforations 29. The feeding perforations 29 pass through the lower tape 26. The lower tape 26 may be in the same width as a cover tape as hereinafter described, and in this case, no feeding perforation 29 passes through the lower tape 26.

The receiving tape 24 is provided on its upper surface with stepped portions 30. Thus, seal regions 31 and lower regions 32 are bounded by the stepped portions 30. A cover tape 33 of thermoplastic resin is arranged along the longitudinal direction of the receiving tape 24. The cover tape 33 can be heat-sealed within the range of the seal regions 31 through use of the sealing iron 9 as shown in FIGS. 14 and 15. Thus, the heat-sealed portions are formed substantially in constant width.

Although the present invention has been described with reference to several embodiments as shown in the drawings, further modifications can be carried out within the scope of the present invention.

Figure 9:
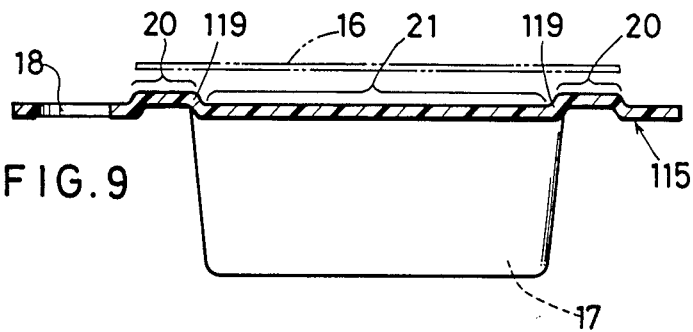
FIG. 9 is a sectional view similar to that of FIG. 2 and shows an electronic component series according to a still further embodiment of the present invention.

For example, the aforementioned four embodiments can be modified as shown in FIGS. 9 to 12 respectively. FIG. 9 corresponds to FIG. 2 and FIG. 10 corresponds to FIG. 5 while FIG. 11 corresponds to FIG. 7 and FIG. 12 corresponds to FIG. 8 respectively.

Figure 10:
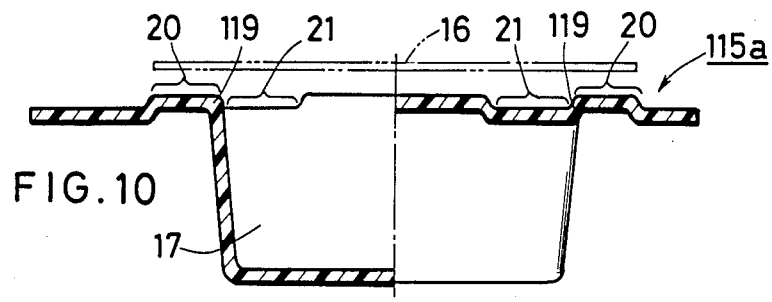
FIG. 10 is a sectional view similar to that of FIG. 5 and shows a receiving tape 115a employed in a further embodiment of the present invention.
Figure 11:
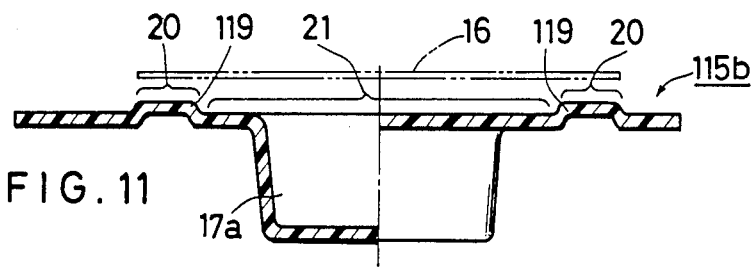
FIG. 11 is a sectional view similar to that of FIG. 7 and shows a receiving tape 115b employed in a further embodiment of the present invention.
Figure 12:
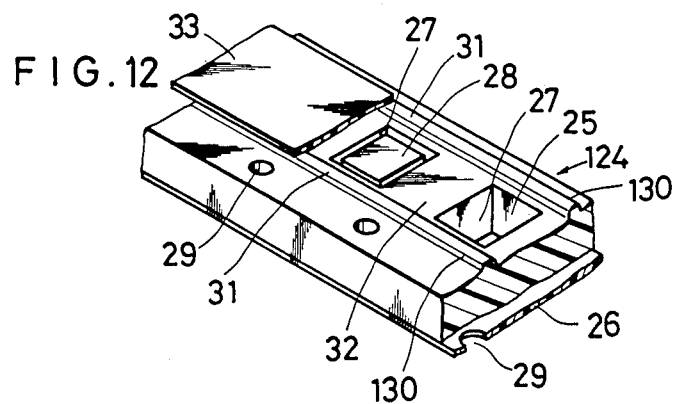
FIG. 12 is a perspective view similar to that of FIG. 8 and partially shows an electronic component series according to a further embodiment of the present invention.

In each of the embodiments as shown in FIGS. 9 to 11, two protrusions 119 are formed with stepped portions provided on both sides thereof. Further, in the embodiment as shown in FIG. 12, two protrusions 130 are formed with stepped portions provided on both sides thereof. Other configurations of these embodiments are similar to those of the said corresponding embodiments, and hence the corresponding parts are shown by the same reference numerals, while overlapping description is omitted.

The protrusions 119 and 130 as shown in FIGS. 9 to 12 extend linearly along the longitudinal directions of receiving tapes 115, 115a, 115b and 124 in parallel with each other in prescribed widths. The protrusions 119 as shown in FIGS. 9 to 11 can be readily formed by embossing simultaneously with receiving concavities 17. The protrusions 130 as shown in FIG. 12 can be readily formed in a step of molding the receiving tape 124 by resin. The upper surfaces of the protrusions 119 and 130 are made relatively flat, to be formed with regions to be in contact with cover tapes 16 and 33 for sealing, i.e., seal regions 20 and 31. The upper surfaces of the protrusions 119 and 130 are made flat in order to ensure adhesion of the cover tapes 16 and 33, but the same are not necessarily flat.

The cover tapes 16 and 33 are heat-sealed to the receiving tapes 115, 115a, 115b and 124 by the sealing iron 9 as shown in FIGS. 14 and 15, whereby heat-sealed portions 22 correspond to the seal regions 20 and are defined in width by the protrusions 119 and 130.

The protrusions 119 as shown in FIGS. 9 to 11 may not be formed by embossing, but by partially increasing the sheets of thermoplastic resin in thickness.

Although the electronic components 14 and 28 are extremely roughly illustrated in the aforementioned embodiments, such electronic components are generally intended to be chip-like ones, such as monolithic capacitors or resisters. However, the present invention can also be applied to electronic component series in which electronic components having protruding lead terminals are received in concavities.

Further, although the cover tapes 16 and 33 employed in the aforementioned embodiments themselves are formed by thermoplastic resin, such thermoplastic resin may be provided in at least on surfaces opposite to the receiving tapes in order to attain heat sealing, and the cover tapes may be prepared by other materials coated with thermoplastic resin.

In addition, the receiving tapes 24 and 124 as shown in FIGS. 8 and 12 may be integrally formed with bottom walls corresponding to the lower tapes 26. Such a receiving tape provided with receiving concavities 27 within the thickness thereof and having covered bottom surfaces can be easily manufactured by, e.g., resin molding.

Although the present invention has been described and illustrated in detail, it is clearly understood that the same is by way of illustration and example only and is not to be taken by way of limitation, the scope of the present invention being limited only by the terms of the appended claims.

What is claimed is:

1. An electronic component series comprising a cover tape and a receiving tape, wherein the force required for separating the cover tape from the receiving tape is substantially constant over the length of the electronic component series, said receiving tape including a plurality of receiving concavities for respectively receiving electronic components and distributed in the longitudinal direction of said receiving tape, and said cover tape being arranged along the longitudinal direction of said receiving tape to cover said receiving concavities for retaining said electronic components in respective said receiving concavities, said cover tape and said receiving tape being heat-sealed together in sealed regions close to both side edges thereof, said sealed regions having substantially constant width over the length of the electronic component series for providing said substantially constant separating force, said cover tape being sealed to said receiving tape by thermoplastic resin provided at least on a surface of said cover tape facing said receiving tape, and the surface of said receiving tape facing said cover tape having recessed regions formed therein which are lower than said sealed regions, said recessed regions being bounded by stepped portions linearly extending along the longitudinal direction of said receiving tape, said recessed regions being laterally between said sealed regions and spaced away from said cover tape by said stepped portions.

2. An electronic component series in accordance with claim 1, wherein said receiving tape is formed of a sheet of thermoplastic resin, said receiving concavities and said stepped portions being formed by embossing said sheet of thermoplastic resin.

3. An electronic component series in accordance with claim 1, wherein said receiving tape has thickness in a direction perpendicular to its longitudinal direction, said receiving concavities being formed within the range of said thickness.

4. An electronic component series in accordance with claim 1, wherein said recessed regions are formed between said receiving concavities.

5. An electronic component series in accordance with claim 1, wherein depressed regions lower than said sealed regions are formed in said receiving tape laterally outside said stepped portions along the longitudinal direction of said receiving tape.

6. An electronic component series in accordance with claim 5, wherein said depressed regions are formed by two parallel protrusions formed in said receiving tape laterally inside said depressed regions, said protrusions extending linearly along the longitudinal direction of said receiving tape and laterally outside said receiving concavities.

7. An electronic component series in accordance with claim 1, wherein said cover tape is entirely formed of thermoplastic resin.

8. An electronic component series comprising a cover tape and a receiving tape, wherein the force required for separating the cover tape from the receiving tape is substantially constant over the length of the electronic component series, said receiving tape including a plurality of receiving concavities for respectively receiving electronic components and distributed in the longitudinal direction of said receiving tape, and said cover tape being arranged along the longitudinal direction of said receiving tape to cover said receiving concavities for retaining said electronic components in respective said receiving concavities, said cover tape and said receiving tape being heat-sealed together in sealed regions close to both side edges thereof, said sealed regions having substantially constant width over the length of the electronic component series for providing said substantially constant separating force, said cover tape being sealed to said receiving tape by thermoplastic resin provided at least on a surface of said cover tape facing said receiving tape, and the surface of said receiving tape facing said cover tape having recessed regions formed between said receiving concavities which are lower than said sealed regions, said recessed regions being bounded by stepped portions linearly extending along the longitudinal direction of said receiving tape, said recessed regions being laterally between said sealed regions and spaced away from said cover tape by said stepped portions, wherein said receiving tape has lateral edge portions which are laterally outside said stepped portions, said edge portions being substantially flat and coplanar, and said edge portions extending from said stepped portions to extreme edges along the longitudinal direction of said receiving tape so as to include said sealed regions.

9. An electronic component series comprising a cover tape and a receiving tape, wherein the force required for separating the cover tape from the receiving tape is substantially constant over the length of the electronic component series, said receiving tape including a plurality of receiving concavities for respectively receiving electronic components and distributed in the longitudinal direction of said receiving tape, and said cover tape being arranged along the longitudinal direction of said receiving tape to cover said receiving concavities for retaining said electronic components in respective said receiving concavities, said cover tape and said receiving tape being heat-sealed together in sealed regions close to both side edges thereof, said sealed regions having substantially constant width over the length of the electronic component series for providing said substantially constant separating force, said cover tape being sealed to said receiving tape by thermoplastic resin provided at least on a surface of said cover tape facing said receiving tape, and the surface of said receiving tape facing said cover tape having two parallel protrusions formed therein which linearly extend along the longitudinal direction of said receiving tape and have a prescribed width for providing said substantially constant width of said sealed regions, said receiving concavities being positioned laterally between said two protrusions and said cover tape being sealed to said two protrusions to form said sealed regions.

10. An electronic component series in accordance with claim 9, wherein said receiving tape is formed of a sheet of thermoplastic resin, said receiving concavities and said protrusions being formed by embossing said sheet of thermoplastic resin.

11. An electronic component series in accordance with claim 9, wherein said receiving tape has thickness in a direction perpendicular to its longitudinal direction, said receiving concavities being formed within the range of said thickness.

12. An electronic component series in accordance with claim 9, wherein said cover tape is entirely formed of thermoplastic resin.

* * * * *